(12) United States Patent
Kawano et al.

(10) Patent No.: US 7,130,195 B2
(45) Date of Patent: Oct. 31, 2006

(54) ELECTRONIC APPARATUS

(75) Inventors: Koji Kawano, Komatsu (JP); Yutaka Shinza, Kanazawa (JP); Shinya Harada, Komatsu (JP); Akimasa Matsushima, Ishikawa-ken (JP)

(73) Assignee: Muratas Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/849,441

(22) Filed: May 20, 2004

(65) Prior Publication Data

US 2005/0018405 A1     Jan. 27, 2005

(30) Foreign Application Priority Data

Jul. 24, 2003 (JP) .............................. 2003-201281

(51) Int. Cl.
*H05K 7/20* (2006.01)
(52) U.S. Cl. .................. 361/719; 361/704; 361/720; 165/80.2
(58) Field of Classification Search ........ 361/688–690, 361/704, 707, 712, 715, 717–720, 736, 737, 361/752, 753, 796, 799; 174/50.51, 50.52, 174/51
See application file for complete search history.

(56) References Cited

U.S. PATENT DOCUMENTS

| | | | | |
|---|---|---|---|---|
| 5,034,856 A | * | 7/1991 | Cook et al. ................ | 361/816 |
| 5,208,732 A | * | 5/1993 | Baudouin et al. .......... | 361/704 |
| 5,777,844 A | * | 7/1998 | Kiefer ........................ | 361/704 |
| 5,966,648 A | * | 10/1999 | Ortberg et al. ............. | 455/347 |
| 6,049,469 A | * | 4/2000 | Hood et al. ................. | 361/818 |
| 6,065,530 A | * | 5/2000 | Austin et al. .............. | 165/80.3 |
| 6,128,194 A | * | 10/2000 | Francis ....................... | 361/737 |
| 6,327,156 B1 | * | 12/2001 | Wangen ...................... | 361/759 |
| 6,441,520 B1 | * | 8/2002 | Grant ....................... | 310/68 R |
| 6,456,504 B1 | * | 9/2002 | LoForte et al. ............. | 361/799 |
| 6,650,546 B1 | * | 11/2003 | Nelson et al. .............. | 361/738 |
| 6,828,668 B1 | * | 12/2004 | Smith et al. ................ | 257/696 |
| 6,891,730 B1 | * | 5/2005 | Farassat ...................... | 361/769 |
| 6,894,891 B1 | * | 5/2005 | Darr et al. .................. | 361/601 |
| 6,894,903 B1 | * | 5/2005 | Sato et al. .................. | 361/728 |
| 2004/0136162 A1 | * | 7/2004 | Asai et al. .................. | 361/715 |

FOREIGN PATENT DOCUMENTS

JP        2001-217576        8/2001

* cited by examiner

*Primary Examiner*—Boris Chervinsky
(74) *Attorney, Agent, or Firm*—Keating&Bennett, LLP

(57) ABSTRACT

An electronic apparatus includes a heat-generating device mounted on a surface of a printed circuit board and is surrounded with wall members of a housing. The wall members are connected to a ground electrode on the other surface of the printed circuit board, the ground electrode being disposed over substantially the entire surface under the heat-generating device. Lugs provided in covers are in contact with the respective ends of the wall members. The direction in which each lug is raised (direction from the base to the tip) coincides with the direction from the heat-generating device to a temperature-increase restricted region.

19 Claims, 4 Drawing Sheets

SECTION III-III

SECTION III-III

ELECTRONIC APPARATUS

BACKGROUND OF THE INVENTION

1. Field of the Invention

The present invention relates to an electronic apparatus having a housing including a plurality of wall members including external walls and at least one partition wall, a printed circuit board disposed in the housing, electronic devices mounted on the printed circuit board, and covers covering respective openings of the housing.

2. Description of the Related Art

As disclosed in Japanese Unexamined Patent Application Publication No. 2001-217576, a known electronic apparatus such as a tuner includes a frame-like housing composed of a plurality of wall members including external walls and at least one partition wall, a printed circuit board disposed in the housing, main surfaces of the printed circuit board being substantially parallel to opening surfaces of the housing, electronic devices mounted on the printed circuit board, and covers covering respective openings of the housing. Since a heat-generating device, which generates heat in an operation mode, is often mounted on the printed circuit board, a mechanism for heat dissipation is required for normal operation of the electronic apparatus. In the electronic apparatus disclosed in Japanese Unexamined Patent Application Publication No. 2001-217576, a raised lug provided in the cover is bent to the heat-generating device so as to be in contact with the tip of the lug to the external surface of the heat-generating device, thereby dissipating the heat of the heat-generating device to the cover.

However, the amount of heat dissipated by putting the raised lug into contact with the heat-generating device is not necessarily sufficient. In particular, when the heat-generating device is a resin-molded IC, heat may not be sufficiently dissipated due to high heat resistance to the lug. In the electronic apparatus disclosed in Japanese Unexamined Patent Application Publication No. 2001-217576, heat is also dissipated from the heat-generating device to, for example, an electrode and a metal piece that are disposed on the region under the heat-generating device, the region being included in the undersurface of the printed circuit board. The problem arising here is that other circuits and devices cannot be mounted in this region.

Moreover, the dissipated heat may lead to an excessive temperature increase in the other devices. Even if this falls within the thermal design and thus presents no problem in terms of operation of the electronic apparatus, an excessive temperature increase in the area that may be touched by users may be of concern to users. In a tuner installed in electronic equipment, for example, an RF connector for inputting RF signals is exposed and may be touched by users.

SUMMARY OF THE INVENTION

In order to solve the problems described above, preferred embodiments of the present invention provide an electronic apparatus that has a heat dissipation mechanism for not only dissipating the heat of the heat-generating device but also preventing a temperature increase in a particular area (a temperature-increase restricted region).

According to a first preferred embodiment of the present invention, an electronic apparatus includes a frame-like housing including a plurality of wall members including external walls and at least one partition wall, a printed circuit board disposed in the housing, main surfaces of the printed circuit board being substantially parallel to opening surfaces of the housing, a heat-generating device disposed on the printed circuit board, covers covering the respective opening surfaces of the housing, and at least one raised lug provided in at least one of the covers. Some of the wall members surround the heat-generating device, and a tip of the lug is in contact with one of the wall members surrounding the heat-generating device. As a result, heat is effectively dissipated.

According to a second preferred embodiment of the present invention, the electronic apparatus according to the preferred described above may further include a ground electrode disposed on the printed circuit board. The wall members are conductive and are electrically connected to the ground electrode. As a result, heat is effectively dissipated.

According to a third preferred embodiment of the present invention, the electronic apparatus according to the above-described preferred embodiment may further include an electronic component in a temperature-increase restricted region of the electronic apparatus. The direction from the base of the lug to the tip of the lug is the same as the direction from the heat-generating device to the temperature-increase restricted region, thereby preventing any increase in temperature in the temperature-increase restricted region is prevented.

According to a fourth preferred embodiment of the present invention, in the electronic apparatus according to the preferred embodiment described above, at least one of the covers may be provided with a plurality of holes in a heat-barrier region between the lug and the temperature-increase restricted region, the holes being arranged in a direction crossing the direction from the lug to the temperature-increase restricted region, thereby any increase in temperature in the temperature-increase restricted region is prevented.

According to a fifth preferred embodiment of the present invention, in the electronic apparatus according to the preferred embodiment described above, the plurality of holes may be arranged in a zigzag pattern, or staggered in a direction crossing the direction from the lug to the temperature-increase restricted region, thereby reliably preventing any increase in temperature in the temperature-increase restricted region.

According to a sixth preferred embodiment of the present invention, in the electronic apparatus according to the preferred embodiment described above, the total area of the plurality of holes in the cover may be not more than approximately two-thirds the area of the heat-barrier region, thereby preventing any increase in temperature in the temperature-increase restricted region.

According to a seventh preferred embodiment of the present invention, in the electronic apparatus according to the preferred embodiment described above, the printed circuit board may be provided with at least one slit extending in a direction crossing the direction from the heat-generating device to the temperature-increase restricted region, thereby preventing any increase in temperature in the temperature-increase restricted region.

According to a eighth preferred embodiment of the present invention, in the electronic apparatus according to the preferred embodiment described above, the total length of the at least one slit may be at least one-third of the width of the printed circuit board in the direction of the extension of the slit, thereby preventing any increase in temperature in the temperature-increase restricted region.

According to a ninth preferred embodiment of the present invention, in the electronic apparatus according to the preferred embodiment described above, the width of the ground electrode on the printed circuit board may be narrowed in the region between the heat-generating device and the temperature-increase restricted region, thereby preventing any increase in temperature in the temperature-increase restricted region.

According to a tenth preferred embodiment of the present invention, in the electronic apparatus according to the preferred embodiment described above, a hole may be provided in one of the wall members of the housing between the heat-generating device and the temperature-increase restricted region, the hole having a diameter of not less than about one-half the height of the wall member, thereby preventing any increase in temperature in the temperature-increase restricted region.

These and various other features, elements, characteristics and advantages of the present invention will become more apparent from the following detailed description of preferred embodiments thereof with reference to the attached drawings.

DETAILED DESCRIPTION OF THE PREFERRED EMBODIMENTS

Figure 1:
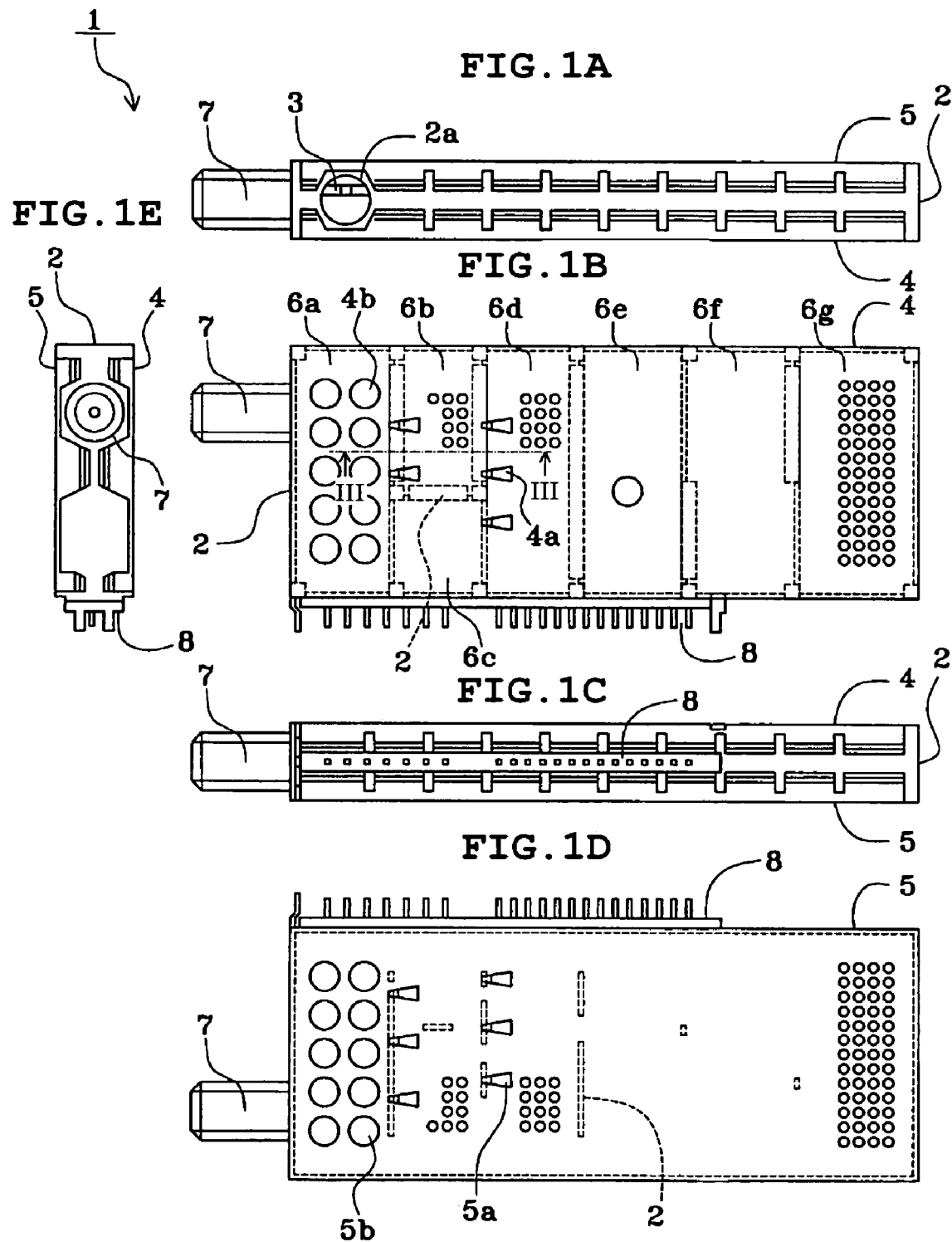
FIGS. 1A to 1E are external views showing five aspects of an electronic apparatus according to a preferred embodiment of the present invention.
Figure 2:
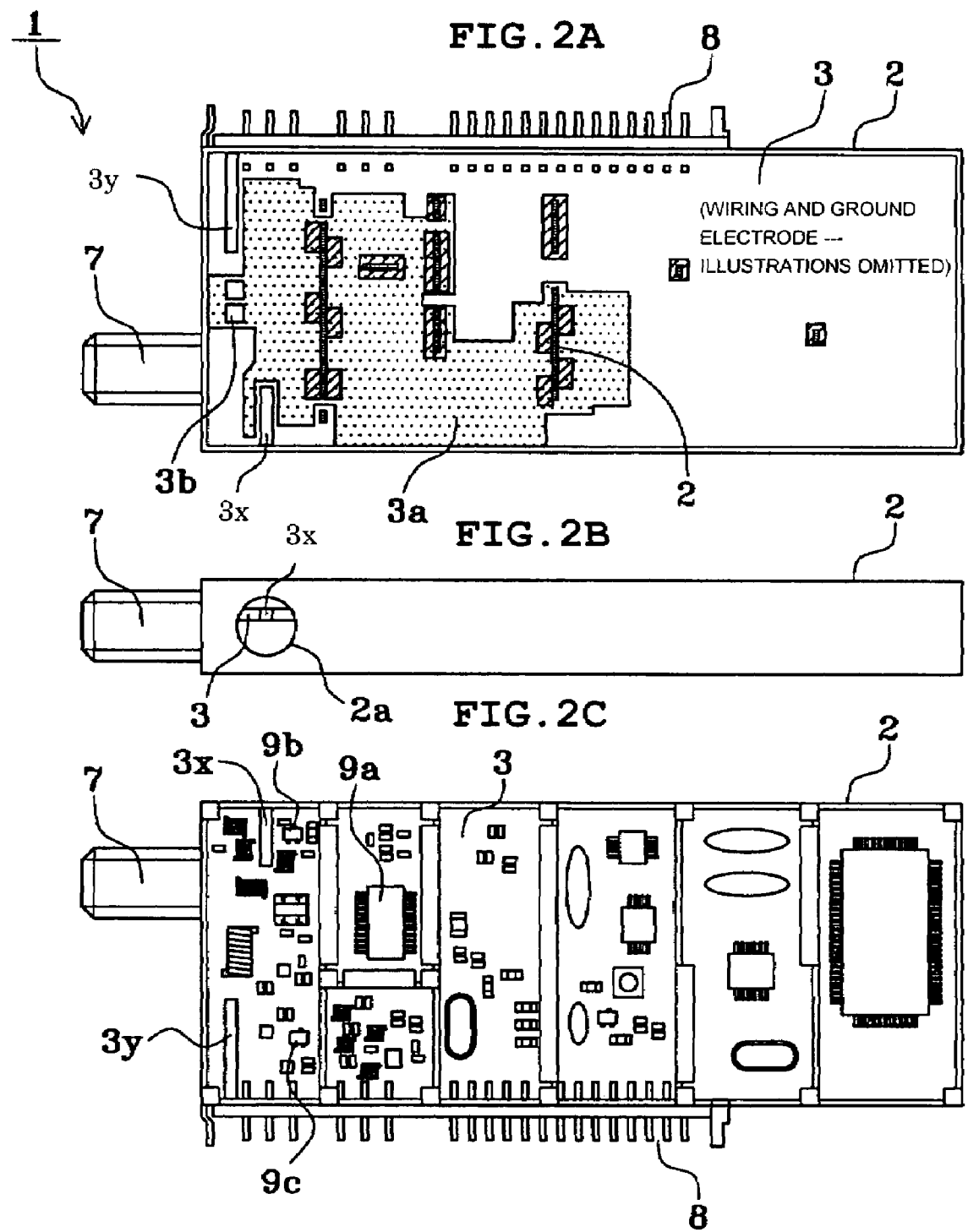
FIGS. 2A to 2C are external views showing three aspects of the uncovered electronic apparatus in FIG. 1.
Figure 3:
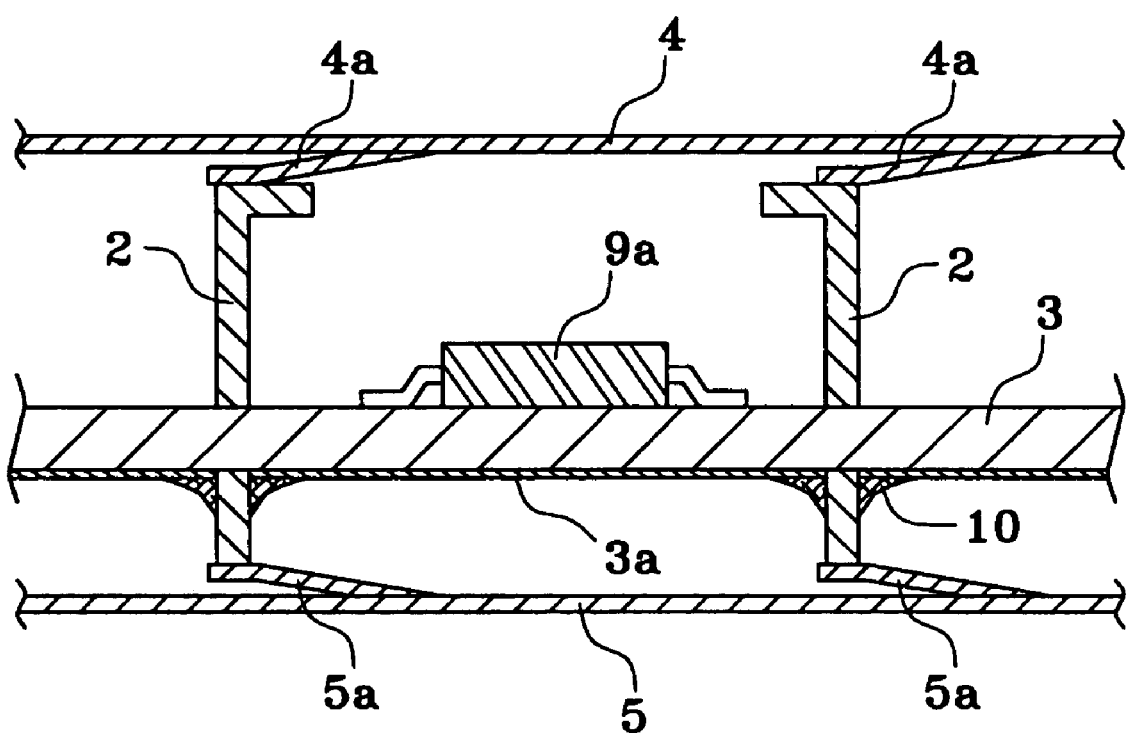
FIG. 3 is a cross-sectional view taken along line III—III in FIG. 1B.

FIGS. 1A to 1E are external views showing five aspects of an electronic apparatus according to various preferred embodiments of the present invention. FIG. 1B is a plan view, FIGS. 1A, 1C, and 1E are side views, and FIG. 1D is an underside view. FIGS. 2A to 2C are external views showing three aspects of the uncovered electronic apparatus in FIG. 1. FIG. 2C is a plan view, FIG. 2B is a side view, and FIG. 2A is an underside view. Further, FIG. 3 is a cross-sectional view taken along line III—III in FIG. 1B.

An electronic apparatus 1 according to a preferred embodiment of the present invention is preferably configured as a tuner. As shown in FIGS. 1 and 2, the electronic apparatus 1 includes a metal housing 2 provided with substantially rectangular openings, a printed circuit board 3 disposed in the housing 2, the printed circuit board 3 being substantially parallel to opening surfaces of the housing 2, and a metal cover 4 and a metal cover 5 covering one opening (a first opening) and the other opening (a second opening), respectively, of the housing 2.

A plurality of wall members including external walls and partition walls are connected to form the housing 2. In the housing 2, a large frame preferably includes a plurality of small frames. Some of the wall members are bent at an approximately 90-degree angle in the first opening of the housing 2, thereby extending the areas of end portions of the wall members when viewed from the first opening of the housing 2. As for the height of the wall members, the partition walls are lower than the external walls.

The plan views in FIGS. 1B and 2C show the electronic apparatus 1 viewed from the first opening of the housing 2. In FIGS. 1B and 1D, only the wall members are indicated by dashed lines to clarify the positional relationship between the holes and lugs in the covers 4 and 5 (described below), and the wall members of the housing 2.

The printed circuit board 3 is a substantially rectangular wiring board slightly smaller than the openings of the housing 2 and is provided with a plurality of slits (not shown). The end portions of some of the wall members (partition walls) of the housing 2 extend from one main surface (first surface) of the printed circuit board 3 through the respective slits to reach the second opening side of the housing 2 and are fixed by soldering. Thus, the printed circuit board 3 is disposed in and integrated with the housing 2. Therefore, the direction that is substantially perpendicular to the printed circuit board 3 coincides with the direction that is substantially perpendicular to the opening surfaces of the housing 2. Furthermore, the first surface and the other main surface (second surface) of the printed circuit board 3 correspond to the first opening side and the second opening side of the housing 2, respectively. The first surface side of the printed circuit board 3 placed in the housing 2 is divided into chambers 6a to 6g separated by the plurality of wall members of the housing 2. As shown in FIG. 3, the end portions of some of the wall members extending through the slits are projected to the second surface side of the printed circuit board 3.

To secure the printed circuit board 3 to the housing 2, the housing 2 and a ground electrode 3a on the printed circuit board 3 are soldered. Reference numeral 10 in FIG. 3 denotes solder. Thus, the housing 2 is electrically at ground potential. Moreover, the housing 2 is thermally connected through a small resistance to, for example, the ground electrode 3a on the printed circuit board 3. Referring to FIG. 2A, the areas in which the ground electrode 3a and the housing 2 are soldered are indicated by hatching. The areas surrounded by the hatched areas are the end portions of the wall members inserted in the slits of the printed circuit board 3. In FIG. 2A, illustrations of wiring and ground electrodes, except for the ground electrode 3a on the second surface of the printed circuit board 3, are omitted.

An RF connector 7 which defines a connector for RF signal input is provided on a side surface along a shorter side of the housing 2. The outer portion of the RF connector 7 is secured to the housing 2, while a central conductor thereof is connected to a wire (not shown) on the printed circuit board 3. The RF connector 7 may be touched by users after installation to electric equipment. Therefore, the RF connector 7 and its adjacent areas are temperature-increase restricted regions. A connector 8 with a plurality of pin terminals is provided on a side surface along a longer side of the housing 2, the pin terminals being connected to the respective wires (not shown) on the printed circuit board 3. On the side surface along the other longer side of the housing 2, a hole 2a having a diameter of about three-fourths of the height of the wall member is provided at a position facing the chamber 6a.

Circuits (not shown) are mounted on both surfaces of the printed circuit board 3. Various electronic devices such as an IC, a chip capacitor, a chip resistor, a quartz oscillator, and a coil are mainly mounted on the first surface of the printed circuit board 3. The electronic devices include heat-generating devices 9a, 9b, and 9c that generate an increased amount of heat in operation mode. The heat-generating device 9a is positioned in the chamber 6b, while the heat-generating devices 9b and 9c are positioned in the chamber 6a. FIG. 3, which is a cross-sectional view taken along line III—III in FIG. 1, shows a cross-sectional view of the heat-generating device 9a in the chamber 6b. In the second surface of the printed circuit board 3, a substantial portion of the areas under the heat-generating devices 9a, 9b, and 9c are covered with the ground electrode 3a that is connected to the wall members of the housing 2.

The ground electrode 3a on the second surface of the printed circuit board 3 extends from the position under the heat-generating device 9a toward the end portion to which the RF connector 7 is connected. The width of the ground electrode 3a decreases in the vicinity of the RF connector 7. That is, the ground electrode 3a has a narrowed portion 3b.

The chamber 6a of the printed circuit board 3 is provided with two slits 3x and 3y extending in the width direction of the printed circuit board 3 from the respective sides. The slit 3x extends so as to block the line between the heat-generating device 9b and the RF connector 7, while the slit 3y extends so as to block the line between the heat-generating device 9c and the RF connector 7. The total length of the slits 3x and 3y is about one-half the width of the printed circuit board 3.

The cover 4 is provided with five raised lugs 4a, ten large-diameter holes 4b, and a plurality of other holes.

Each lug 4a is preferably substantially trapezoidal in shape. The base of the lug 4a, which corresponds to the lower base of the trapezoid, is connected to the cover 4. As shown in FIG. 3, the lug 4a is bent from the base toward the housing 2 (printed circuit board 3). The tip of the lug 4a, which corresponds to the upper base of the trapezoid, is in contact with the end of a wall member projected to the first surface side of the printed circuit board 3. Moreover, four out of the five lugs 4a are in contact with the respective ends of the wall members surrounding the chamber 6b. The direction from the base to the tip of each lug 4a, that is, the direction in which the lug 4a is raised, coincides with the direction from the heat-generating device 9a toward the RF connector 7, that is, the direction toward the temperature-increase restricted region.

All the large-diameter holes 4b in the cover 4 are arranged such that they are located above the chamber 6a when the cover 4 covers the opening of the housing 2. Thus, the holes 4b are provided in the heat-barrier region between the lugs and the region adjacent to the temperature-increase restricted region (left end in FIG. 1B).

The cover 5 is provided with six raised lugs 5a, ten large-diameter holes 5b, and a plurality of other holes.

Each lug 5a is preferably substantially trapezoidal in shape. The base of the lug 5a, which corresponds to the lower base of the trapezoid, is connected to the cover 5. As shown in FIG. 3, the lug 5a is bent from the base toward the housing 2 (printed circuit board 3). The tip of the lug 5a, which corresponds to the upper base of the trapezoid, is in contact with the end of a wall member projected to the second surface side of the printed circuit board 3. Moreover, four out of the six lugs 5a are in contact with the respective ends of the wall members surrounding the chamber 6b. The direction from the base to the tip of each lug 5a coincides with the direction from the heat-generating device 9a toward the RF connector 7, that is, the direction toward the temperature-increase restricted region.

All the large-diameter holes 5b in the cover 5 are arranged such that they are located under the chamber 6a when the cover 5 covers the opening of the housing 2. Thus, the holes 5b are provided in the heat-barrier region between the lugs 5a and the region adjacent to the temperature-increase restricted region (left end in FIG. 1D).

In the electronic apparatus 1 described above, some of the wall members of the housing 2 surround the heat-generating device 9a. The heat generated by the heat-generating device 9a is thus blocked by the surrounding wall members and is prevented from spreading over a wide range of the printed circuit board 3.

The ends of these wall members are in contact with the raised lugs 4a and the lugs 5a, and thus are electrically and thermally connected to the cover 4 and the cover 5, respectively. The heat generated by the heat-generating device 9a is thus efficiently transferred to the covers 4 and 5 and is dissipated into the air.

These wall members are also electrically and thermally connected to the ground electrode 3a on the printed circuit board 3. Therefore, the heat transferred from the heat-generating device 9a to the printed circuit board 3 is further transferred via the ground electrode 3a and the wall members to the covers 4 and 5 to be dissipated.

In the electronic apparatus 1, the direction from the base to the tip of each of the lugs 4a and 5a coincides with the direction from the heat-generating device 9a toward the RF connector 7, that is, the direction toward the temperature-increase restricted region. Since the heat is transferred from the tip to the base in each of the lugs 4a and 5a, the direction of the heat transfer is opposite to the direction from the heat-generating device 9a to the RF connector 7. Thus, a temperature increase in the RF connector 7 caused by the heat generated in the heat-generating device 9a and transferred via the covers 4 and 5 to the RF connector 7 can be prevented.

In the cover 4, the large-diameter holes 4b are provided in the heat-barrier region between the lugs 4a and the region adjacent to the RF connector 7. Similarly, in the cover 5, the large-diameter holes 5b are provided in the heat-barrier region between the lugs 5a and the region adjacent to the RF connector 7. The holes 4b and 5b not only dissipate the heat in the chamber 6a but also increase the heat resistance of the covers 4 and 5 in the heat-barrier regions between the lugs 4a and 5a and the RF connector 7. That is, since the covers 4 and 5 are provided with the holes 4b and 5b, the area of the heat-barrier regions, exclusive of the area of the holes 4b and 5b, is reduced to about one-half. Therefore, heat is not easily transferred from the lugs 4a and 5a to the RF connector 7 because of high heat resistance. Thus, the temperature increase in the RF connector 7 caused by the heat generated in the heat-generating device 9a and transferred via the covers 4 and 5 to the RF connector 7 can be prevented.

The wall member facing the chamber 6a and located on a side of the housing 2 is provided with the hole 2a having a diameter of about three-fourths the height of the wall member. The hole 2a is located in the housing 2, between the region adjacent to the heat-generating device 9a and the region to which the RF connector 7 is secured. Therefore, the area of the housing 2 in this region is reduced, thereby increasing the heat resistance. Thus, the temperature increase in the RF connector 7 caused by the heat generated in the heat-generating device 9a and transferred via the housing 2 to the RF connector 7 can be prevented.

Since the slit 3x on the printed circuit board 3 blocks the line between the heat-generating device 9b and the RF connector 7, heat transfer from the heat-generating device 9b via the printed circuit board 3 to the RF connector 7 can be prevented. Similarly, since the slit 3y on the printed circuit board 3 blocks the line between the heat-generating device 9c and the RF connector 7, heat transfer from the heat-generating device 9c via the printed circuit board 3 to the RF connector 7 can be prevented. The slits 3x and 3y are located, on the printed circuit board 3, in the region between the heat-generating device 9a and the point to which the RF connector 7 is connected. Furthermore, the total length of the slits 3x and 3y is about half the width of the printed circuit board 3. This is equivalent to reducing the area of the printed circuit board 3 in this region by about one-half. In addition to the lugs 4a and 5a in the covers 4 and 5, this also prevents the heat generated in the heat-generating device 9a from being transferred via the printed circuit board 3 to the RF connector 7.

Printed circuit boards are preferably made of resin with relatively low heat conductivity, while electrodes are made of metal with high heat conductivity. Therefore, heat in the printed circuit board 3 is more easily transferred via a large electrode than via the printed circuit board 3. In the ground electrode 3a on the second surface of the printed circuit board 3, the narrowed portion 3b is provided between the area under the heat-generating devices 9a, 9b, and 9c and the end to which the RF connector 7 is connected. In addition to the lugs 4a and 5a in the covers 4 and 5, and the slits 3x and 3y in the printed circuit board 3, the narrowed portion 3b also prevents heat transfer in the ground electrode 3a. The heat generated in the heat-generating device 9a is thus prevented from being transferred via the ground electrode 3a of the printed circuit board 3 to the RF connector 7.

In the electronic apparatus 1 of various preferred embodiments of the present invention, a temperature increase in the temperature-increase restricted region caused by the heat generated in the heat-generating devices and transferred to the temperature-increase restricted region can be effectively prevented by the several mechanisms described above.

Figure 4:
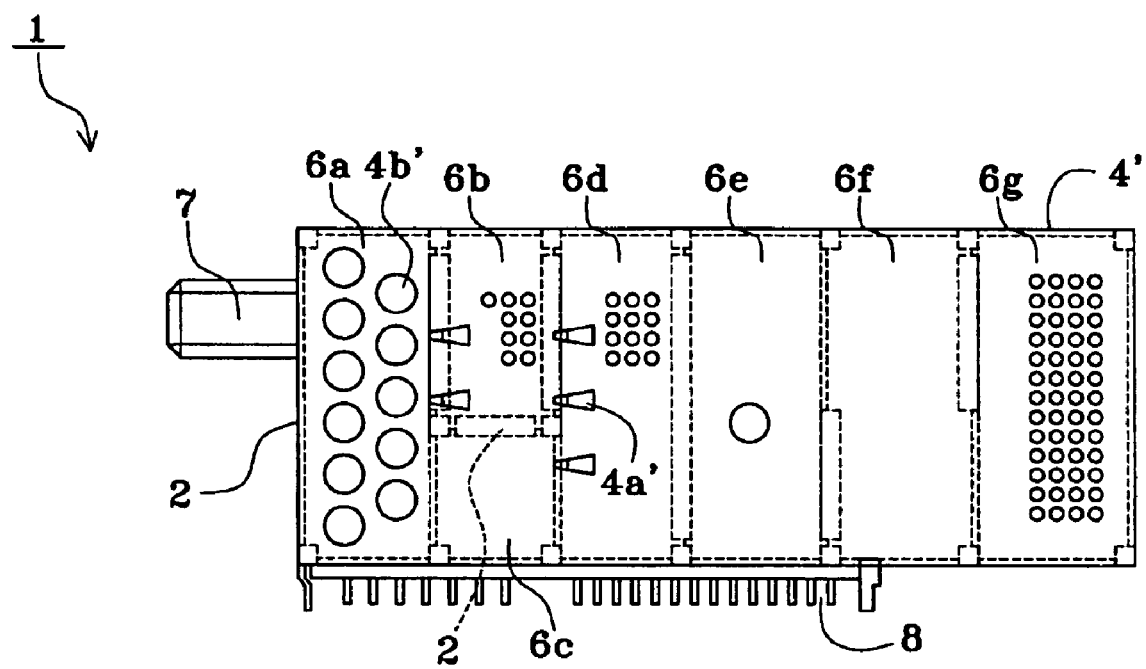
FIG. 4 is a plan view showing a modification of a cover of the electronic apparatus according to another preferred embodiment of the present invention.

FIG. 4 is a plan view showing a modification of the cover of the electronic apparatus according to preferred embodiments of the present invention. In the modified cover, the arrangement of the holes is different from that of the preferred embodiments described above in which the holes 4b are arranged in two lines in the width direction of the cover 4. In the above-described preferred embodiment, two holes 4b of each row are linearly arranged in the longitudinal direction of the cover 4. In FIG. 4, on the other hand, holes 4b' are arranged in a zigzag configuration, or staggered in the width direction of a cover 4'. Here, the holes 4b' are not linearly arranged in the longitudinal direction of the cover 4'.

Therefore, in the region where the holes 4b' are provided, the distance of heat transfer in the longitudinal direction of the cover 4' increases, and thus, the heat resistance increases. Thus, the temperature increase in the temperature-increase restricted region caused by the heat generated in the heat-generating devices and transferred to the temperature-increase restricted region can be further effectively prevented.

While the housing 2 and the covers 4 and 5 in preferred embodiments are preferably made of metal, they may be made of another conductive material such as plated resin.

While the hole 2a provided in the wall member, which faces the chamber 6a, on the side of the housing 2 preferably has a diameter of about three-fourths the height of the wall member in above-described preferred embodiments, a hole having a diameter of not less than approximately one-half the height of the wall member is capable of preventing heat transfer.

Moreover, when the total length of the slits 3x and 3y provided in the chamber 6a and extending from each side of the printed circuit board 3 in the width direction is not less than about one-third the width of the printed circuit board 3, the slits 3x and 3y are capable of inhibiting heat transfer.

Furthermore, in the heat-barrier region where the holes 4b and 5b are provided, heat transfer can be prevented without sacrificing the strength of the covers 4 and 5, when the total area of the holes 4b and 5b is up to approximately two-thirds that area of heat-barrier region. The holes need not necessarily be circular in shape, but may be, for example, slits extending substantially in the width direction of the covers.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. An electronic apparatus comprising:
    a housing including a plurality of wall members including external walls and at least one partition wall;
    a printed circuit board disposed in the housing, main surfaces of the printed circuit board being substantially parallel to opening surfaces of the housing;
    a heat-generating device disposed on one of the main surfaces of the printed circuit board;
    covers covering the respective opening surfaces of the housing;
    at least one raised lug provided in at least one of the covers; and
    a ground electrode disposed on the other main surface of the printed circuit board;
    wherein some of the plurality of wall members including the at least one partition wall surround the heat-generating device, and a tip of the at least one raised lug is in contact with the at least one partition wall of the plurality of wall members surrounding the heat-generating device; and
    the ground electrode is directly electrically and thermally connected to the at least one partition wall of the plurality of wall members surrounding the heat-generating device.

2. The electronic apparatus according to claim 1, further comprising an electronic component in a temperature-increase restricted region of the electronic apparatus, wherein a direction from the base of the at least one raised lug to the tip of the at least one raised lug is the same as a direction from the heat-generating device to the temperature-increase restricted region.

3. The electronic apparatus according to claim 2, wherein at least one of the covers is provided with a plurality of holes in a heat-barrier region between the at least one raised lug and the temperature-increase restricted region, the holes being arranged in a direction crossing the direction from the at least one raised lug to the temperature-increase restricted region.

4. The electronic apparatus according to claim 3, wherein the plurality of holes are arranged in a zigzag pattern in a direction crossing the direction from the at least one raised lug to the temperature-increase restricted region.

5. The electronic apparatus according to claim 3, wherein the total area of the plurality of holes in the cover is not more than approximately two-thirds the area of the heat-barrier region.

6. The electronic apparatus according to claim 2, wherein the printed circuit board is provided with at least one slit extending in a direction crossing the direction from the heat-generating device to the temperature-increase restricted region.

7. The electronic apparatus according to claim 6, wherein the total length of said at least one slit is at least approximately one-third the width of the printed circuit board in the direction of the extension of the slit.

8. The electronic apparatus according to claim 2, wherein the width of the ground electrode on the printed circuit board is narrowed in the region between the heat-generating device and the temperature-increase restricted region.

9. The electronic apparatus according to claim 2, wherein a hole is provided in one of the plurality of wall members of the housing between the heat-generating device and the temperature-increase restricted region, the hole having a diameter of not less than about one-half the height of the one of the plurality of wall members.

10. An electronic apparatus comprising:
a housing including a plurality of wall members including a plurality of side walls and at least one partition wall;
a printed circuit board disposed in the housing, main surfaces of the printed circuit board being substantially parallel to opening surfaces of the housing;
a heat-generating device disposed on one of the main surfaces of the printed circuit board;
covers fitting into the side wall members and covering the respective opening surfaces of the housing; and
a ground electrode disposed on the other main surface of the printed circuit board; wherein
at least one of the covers includes at least one raised lug provided therein; and
the at least one partition wall is arranged close to the heat-generating device
the at least one partition wall is conductive and is directly electrically and thermally connected to the ground electrode and to the at least one raised lug.

11. The electronic apparatus according to claim 10, wherein some of the plurality of wall members including the at least one partition wall surround the heat-generating device, and a tip of the at least one raised lug is in contact with one of the plurality of wall members surrounding the heat-generating device.

12. The electronic apparatus according to claim 11, further comprising an electronic component in a temperature-increase restricted region of the electronic apparatus, wherein a direction from the base of the at least one raised lug to the tip of the at least one raised lug is the same as a direction from the heat-generating device to the temperature-increase restricted region.

13. The electronic apparatus according to claim 12, wherein at least one of the covers is provided with a plurality of holes in a heat-barrier region between the at least one raised lug and the temperature-increase restricted region, the holes being arranged in a direction crossing the direction from the at least one raised lug to the temperature-increase restricted region.

14. The electronic apparatus according to claim 13, wherein the plurality of holes are arranged in a zigzag pattern in a direction crossing the direction from the at least one raised lug to the temperature-increase restricted region.

15. The electronic apparatus according to claim 13, wherein the total area of the plurality of holes in the cover is not more than approximately two-thirds the area of the heat-barrier region.

16. The electronic apparatus according to claim 12, wherein the printed circuit board is provided with at least one slit extending in a direction crossing the direction from the heat-generating device to the temperature-increase restricted region.

17. The electronic apparatus according to claim 16, wherein the total length of said at least one slit is at least approximately one-third the width of the printed circuit board in the direction of the extension of the slit.

18. The electronic apparatus according to claim 12, wherein the width of the ground electrode on the printed circuit board is narrowed in the region between the heat-generating device and the temperature-increase restricted region.

19. The electronic apparatus according to claim 12, wherein a hole is provided in one of the plurality of wall members of the housing between the heat-generating device and the temperature-increase restricted region, the hole having a diameter of not less than about one-half the height of the one of the plurality of wall members.

* * * * *